(12) United States Patent
Penttonen et al.

(10) Patent No.: US 12,418,198 B2
(45) Date of Patent: Sep. 16, 2025

(54) POWER CONVERTER FOR HARVESTING ELECTRICAL POWER

(71) Applicant: Safegrid Oy, Espoo (FI)

(72) Inventors: Jyrki Penttonen, Helsinki (FI); Jussi Hakunti, Turku (FI)

(73) Assignee: Safegrid Oy, Espoo (FI)

( * ) Notice: Subject to any disclaimer, the term of this patent is extended or adjusted under 35 U.S.C. 154(b) by 0 days.

(21) Appl. No.: 17/780,644

(22) PCT Filed: Nov. 13, 2020

(86) PCT No.: PCT/FI2020/050755
§ 371 (c)(1),
(2) Date: May 27, 2022

(87) PCT Pub. No.: WO2021/105551
PCT Pub. Date: Jun. 3, 2021

(65) Prior Publication Data
US 2023/0361597 A1    Nov. 9, 2023

(30) Foreign Application Priority Data
Nov. 28, 2019    (FI) ...................................... 20196025

(51) Int. Cl.
*H02J 50/00*    (2016.01)
*G01R 15/18*    (2006.01)
(Continued)

(52) U.S. Cl.
CPC .......... *H02J 50/001* (2020.01); *G01R 15/183* (2013.01); *H02J 50/10* (2016.02); *H02M 1/0009* (2021.05); *H02M 7/219* (2013.01)

(58) Field of Classification Search
None
See application file for complete search history.

(56) References Cited

U.S. PATENT DOCUMENTS

| | | | |
|---|---|---|---|
| 2005/0073200 A1* | 4/2005 | Divan | H02J 3/1814 307/44 |
| 2015/0108966 A1 | 4/2015 | Kadonoff | |
| | (Continued) | | |

FOREIGN PATENT DOCUMENTS

WO    2017207037 A1    12/2017

OTHER PUBLICATIONS

Qian et al., "Power maximized and anti-saturation power conditioning circuit for current transformer harvester on overhead lines" Oct. 5, 2018, IET Power Electronics vol. 11, Issue 14 pp. 2179-2402 (Year: 2018).*

(Continued)

*Primary Examiner* — Rexford N Barnie
*Assistant Examiner* — Joel Barnett
(74) *Attorney, Agent, or Firm* — ZIEGLER IP LAW GROUP, LLC.

(57) ABSTRACT

A power harnesser for harvesting electrical power from an electrical power supply including a current transformer arrangeable to surround an electrical power supply such that the electrical power supply induces a secondary current in a secondary winding of current transformer, a power conversion module coupled to the secondary winding of the current transformer, sensing module arrangeable to surround the electrical power supply and operable to measure at least one of: the secondary current, a voltage at first end of the secondary winding, a voltage at second end of the secondary winding; and a control unit coupled to the sensing module and the power conversion module. The control unit is operable to determine a target electrical power, determine regulation attribute for the power conversion module and adjust the power conversion module based on the determined regulation attribute to enable the power conversion module to generate the target electrical power.

11 Claims, 2 Drawing Sheets

(51) Int. Cl.
  *H02J 50/10*    (2016.01)
  *H02M 1/00*     (2007.01)
  *H02M 7/219*    (2006.01)

(56) References Cited

U.S. PATENT DOCUMENTS

| | | | |
|---|---|---|---|
| 2018/0013345 A1* | 1/2018 | Kakuno | H02M 7/48 |
| 2019/0257893 A1* | 8/2019 | Na | G01R 19/165 |
| 2020/0192410 A1* | 6/2020 | Shen | H02J 3/32 |
| 2022/0003828 A1* | 1/2022 | Klumper | H01F 27/402 |

OTHER PUBLICATIONS

Qian et al. "Power maximized . . . " (Year: 2018).*

Finnish Patent and Registration Office, Search Report, Application No. 20196025, mailed Jun. 15, 2020, 1 page.

International Search Report and Written Opinion, European Patent Office, Application No. PCT/FI2020/050755, mailed Jan. 29, 2021, 15 pages.

Ping Li et al., "A High-Efficiency Management Circuit Using Multiwinding Upconversion Current Transformer for Power-Line Energy Harvesting", IEEE Transactions on Industrial Electronics, IEEE Service Center, vol. 62, No. 10, Oct. 1, 2015, ISSN:0278-0046, DOI:10.119/TIE.2015.2431648, 9 pages.

The International Preliminary Report on Patentability, European Patent Office, Application No. PCT/FI2020/050755, mailed Apr. 8, 2022, 14 pages.

Zhiyi Wu et al., "A Power Supply of Self-Powered Online Monitoring Systems for Power Cords", IEEE Transactions on Energy Conversion., vol. 28, No. 4, Dec. 1, 2013, ISSN: 0885-8969, DOI: 10.1109/TEC.2013.2281075, 8 pages.

Zongnan et al., "Power maximised and anti-saturation power conditioning circuit for current transformer harvester on overhead lines", IET Power Electronics, IET, UK, vol. 11 no. 14, Nov. 27, 2018, ISSN: 1755-4535 DOI: 10.1049/IET-PEL.2018.5389, 8 pages.

* cited by examiner

POWER CONVERTER FOR HARVESTING ELECTRICAL POWER

TECHNICAL FIELD

The present disclosure relates generally to power converters for harvesting electrical power from an electrical power supply to provide electricity to sensors; and more specifically, to power converters for providing electrical power to sensors operating in wireless environment. Moreover, the present disclosure relates to methods for harvesting electrical power form an electrical power supply line to provide electricity to wireless sensors.

BACKGROUND

Wireless sensors in distribution grids (namely Internet of Things (IoT) devices) require some power to operate. In many instances power supply is difficult to arrange, for example when installing sensors to a high and medium voltage grids, where suitable low voltage alternating current (AC) supply is not available, not at least easily. Therefore, installation of new wireless sensors in distribution grids are constrained by the non-availability of power sources.

Current transformers (CT) have been used to power wireless sensors which are attached to electrical power supply lines. Present solutions are however not suitable for providing for the sensors operational constantly. Typically, there can be no or very small down time for a wireless sensors. The electronics (central processing unit (CPU), wireless transceivers, signal conditioning etc) of many sensors typically require relatively high power levels, that the traditional methods to harness power from the power supply lines are not adequate. This often leads to complications, such as that the wireless sensor can be on only fraction of the time and sophisticated battery saving algorithms are needed to determine, when to put the electronics to sleep and when to wake up by external circuitry. This is problematic as the complexity of the solution increases and information is lost, since measurements can be done only part of the time. Furthermore, in many applications, such as various fault indicators, immediate action is required, once an event is detected by the sensors. This is only possible, if the wireless sensor is constantly powered.

Typically, a Current Transformer (CT) coupled to a power converter operates to harness AC power from electrical grid supply. The CT is hooked around the electrical grid supply, wherein an alternating voltage is induced by the electrical grid supply in a secondary winding of the CT. Subsequently, the power converter exploits the induced alternating voltage in the secondary winding of the current transformer for power conversion for supply thereof to the load. However, the AC power induced in the current transformer is typically very low.

In an instance, in a Smart Grid environment, at least one wireless sensing load is included, which is not powered adequately owing to difficulty in arranging power supply therefor. Subsequently, reliable operation of the Smart Grid is affected owing to such inadequate power supply to the at least one wireless sensing load.

The problem of how to provide a reliable power converter for harvesting electrical power from an electrical power supply with the control unit needs to be solved.

Therefore, in light of the foregoing discussion, there exists a need to overcome the aforementioned drawbacks associated with conventional devices employed for power conversion.

SUMMARY

The present disclosure seeks to provide efficient power harnessing in wireless sensors using current transformers. An aim of the present disclosure is to provide a solution that overcomes at least partially the problems encountered in prior art, and provides a power converter for converting AC electrical power from electrical power supply to DC output, to be supplied to loads in wireless environment. Furthermore, the present disclosure aims to provide a power harvester which can provide sufficient amount of electrical power to keep the wireless sensors (and other sensors) operational.

In one aspect, an embodiment of the present disclosure provides a power converter for harvesting electrical power from an electrical power supply, the power converter comprising:
  a current transformer (102), the current transformer comprising a secondary winding (104), having a first end and a second end, arranged upon a hollow core (106), wherein the hollow core of the current transformer is arrangeable to surround the electrical power supply line (108) such that the electrical power supply line induces a secondary current in the secondary winding;
  a power conversion module (110) coupled to the secondary winding of the current transformer, via the first end and the second end of the secondary winding;
  at least one sensing module (112) arrangeable to surround the electrical power supply line, wherein the at least one sensing module is operable to measure at least one of: a secondary current, a voltage at the first end of the secondary winding, a voltage at the second end of the secondary winding; and
  a control unit (114) coupled to the at least one sensing module and the power conversion module, wherein the control unit is operable to:
    determine a target electrical power based on sensor data from the at least one sensing module;
    determine a regulation attribute for the power conversion module, based on the target electrical power; and
    adjust the power conversion module based on the determined regulation attribute to enable the power conversion module to generate the target electrical power,
  wherein the control unit further comprises a control loop, wherein the control loop is operable to adjust the power conversion module based on the determined regulation attribute, so that the power conversion module sinks the secondary current in the secondary winding in a manner that the target electrical power is maximized and the core of the current transformer does not get saturated.

In another aspect, an embodiment of the present disclosure provides a method for harvesting electrical power from an electrical power supply, wherein the method is implemented via a power converter comprising a current transformer, a power conversion module, at least one sensing module and a control unit, the method comprising:
  determining, using the control unit, a target electrical power based on sensor data from the at least one sensing module, wherein the sensor data is at least one of: a secondary current in a secondary winding of the current transformer, a voltage at a first end of the secondary winding, a voltage at a second end of the secondary winding;

determining, using the control unit, a regulation attribute for the power conversion module, based on the target electrical power; and adjusting, using the control unit, the power conversion module based on the determined regulation attribute to enable the power conversion module to generate the target electrical power, wherein the method further comprises employing a control loop of the control unit to adjust the power conversion module based on the determined regulation attribute, so that the power conversion module sinks the secondary current in the secondary winding in a manner that the target electrical power is maximized and the core of the current transformer does not get saturated.

In yet another aspect, an embodiment of present disclosure provides a method for harvesting electrical power from an electrical power supply using a power converter as disclosed, the method comprising arranging a current transformer of the power converter to surround the electrical power supply line;

arranging at least one sensing module of the power converter to surround the electrical power supply line;

harvesting electrical power from the electrical power supply; and using the harvested electrical power to power a sensor.

Embodiments of the present disclosure substantially eliminate or at least partially address the aforementioned problems in the prior art, and enables adequate and continuous power supply to loads (for example, sensors) in wireless environment, thereby making the wireless environment (for example, smart grid, Internet of Things, and the like) more reliable and efficient.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
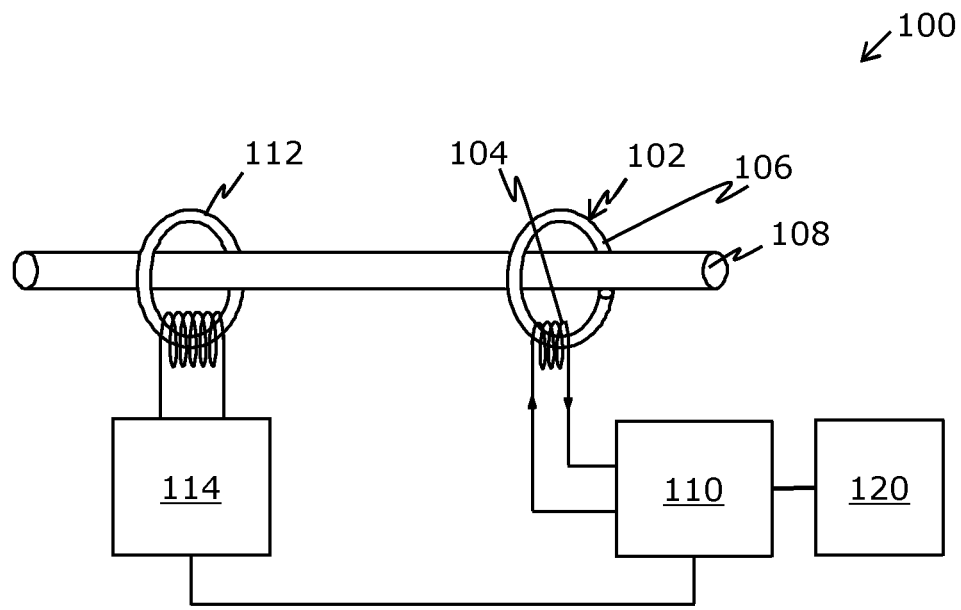
FIG. 1 is a schematic illustration of a power converter, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides a power converter for harvesting electrical power from an electrical power supply, the power converter comprising:

a current transformer (102), the current transformer comprising a secondary winding (104), having a first end and a second end, arranged upon a hollow core (106), wherein the hollow core of the current transformer is arrangeable to surround the electrical power supply line (108) such that the electrical power supply line induces a secondary current in the secondary winding;

a power conversion module (110) coupled to the secondary winding of the current transformer, via the first end and the second end of the secondary winding;

at least one sensing module (112) arrangeable to surround the electrical power supply line, wherein the at least one sensing module is operable to measure at least one of: a secondary current, a voltage at the first end of the secondary winding, a voltage at the second end of the secondary winding; and a control unit (114) coupled to the at least one sensing module and the power conversion module, wherein the control unit is operable to:

determine a target electrical power based on sensor data from the at least one sensing module;

determine a regulation attribute for the power conversion module, based on the target electrical power; and adjust the power conversion module based on the determined regulation attribute to enable the power conversion module to generate the target electrical power, wherein the control unit further comprises a control loop, wherein the control loop is operable to adjust the power conversion module based on the determined regulation attribute, so that the power conversion module sinks the secondary current in the secondary winding in a manner that the target electrical power is maximized and the core of the current transformer does not get saturated.

In another aspect, an embodiment of the present disclosure provides a method for harvesting electrical power from an electrical power supply, wherein the method is implemented via a power converter comprising a current transformer, a power conversion module, at least one sensing module and a control unit, the method comprising:

determining, using the control unit, a target electrical power based on sensor data from the at least one sensing module, wherein the sensor data is at least one of: a secondary current in a secondary winding of the current transformer, a voltage at a first end of the secondary winding, a voltage at a second end of the secondary winding;

determining, using the control unit, a regulation attribute for the power conversion module, based on the target electrical power; and adjusting, using the control unit, the power conversion module based on the determined regulation attribute to enable the power conversion module to generate the target electrical power, wherein the method further comprises employing a control loop of the control unit to adjust the power conversion module based on the determined regulation attribute, so that the power conversion module sinks the secondary current in the secondary winding in a manner that the target electrical power is maximized and the core of the current transformer does not get saturated.

The power converter as described in the present disclosure is a system which harvests electrical power from an electrical power supply. This is done by harnessing the magnetic energy resulting from current flowing in a primary current circuit. Notably, the power converter comprises the control unit that is operable to determine regulation attribute for the power conversion module, wherein the power conversion module generates target electrical power when regulated based on the determined regulation attribute. In this regard, the control unit determines the regulation attribute for the power conversion module based on power required by a load connected to the power conversion module and to enable harnessing of optimal power in the secondary winding of the current transformer, without getting the core of the current transformer to saturate. Beneficially, the power converter aims to supply adequate power to the load thereby preventing pre-mature failure of the load and/or additional energy loss owing to inefficient operation of the load. Furthermore, the power converter as described in the present disclosure is of advantage in wireless environment (for example, Smart Grid environment, Internet of Things (IoT) environment). It will be appreciated that the wireless environment comprises at least one wireless sensing load which is not powered adequately owing to difficulty in arranging power supply therefore. Beneficially, the power converter ensures reliable operation of the wireless sensing load by adequately powering the wireless sensing load from energy harnessed in the secondary winding of the current transformer, even in an event of fault in the system. Moreover, ensuring reliable operation of the at least one sensing load further enables swift operation of the wireless environment.

In this regard, the control unit employed by the power converter automatically adjusts the power conversion module by efficiently performing complex mathematical computations for power conversion.

The present disclosure discloses the power converter for harvesting electrical power from an electrical power supply. Notably, the power harvesting system is an electrical device that converts the magnetic energy created by a primary current (i.e. current flowing in the electrical power supply line) into desired form.

The power converter comprises a current transformer. Notably, the current transformer refers to an electrical device operable to transform current from a higher value into a proportionate current to a lower value. Specifically, the current transformer transforms high voltage current from electrical power supply into low voltage current so as to enable safe monitoring of heavy current flowing through power lines (namely, the electrical power supply line.). Optionally, the current transformer is used with AC instruments, meters or control apparatus. Beneficially, the current transformer reduces a cost of measuring apparatus employed for monitoring of the electrical power supply by substantially decreasing a rating of such measuring apparatus. Moreover, the current transformer enables measurement of high voltage current in economic manner by overcoming difficulty of inadequate insulation in the measuring apparatus.

The electrical power supply refers to a power source that provides electrical power. Examples of the electrical power supply include, but are not limited to, transmission lines, distribution lines, and power lines associated with generators, alternators, solar panels, and the like. Optionally, the electrical power supply is an Alternating power supply. In general, the term "electrical power supply" refers to an electrical power line in which electrical power is flowing.

The current transformer comprises a secondary winding arranged upon a hollow core. The hollow core of the current transformer is arrangeable to surround the electrical power supply such that the electrical power supply induces a secondary current in the secondary winding. In deed the hollow core can be arranged to surround for the electrical power supply (line) when the power converter is used for harvesting electrical power from the electrical power supply. The secondary winding has the first end and the second end. It will be appreciated that the current transformer comprises a core (namely, the hollow core), a primary winding and the secondary winding. Notably, the primary winding of the current transformer consists of at least one turn having a heavy cross-sectional area. The primary winding is connected in series with the electrical power supply. Optionally, the electrical power supply forms the primary winding of the current transformer. Furthermore, the secondary winding of the current transformer comprises a plurality of turns having a small cross-sectional area. In an example, the secondary winding has turns in a range of 100 to 1000.

The primary winding carries full load current to be supplied to a main load and the secondary winding delivers 5 Amperes (A) or 1 A current at full load current in the primary winding. Furthermore, the core of the current transformer is constructed so as to provide required magnetic path for induction of current from primary winding to the secondary winding, with minimum magnetic losses. Optionally, a structure of the core is, for example, a ring, a rectangle, a window type, and so forth. More optionally, the core is constructed using a material that ensures low reluctance thereby reducing core loss of the current transformer. Optionally, the core is constructed using, for example, iron, rolled silicon steel, cold rolled grain-oriented silicon steel, Permalloy, Mumetal, and the like.

Pursuant to embodiments of the present disclosure, the core is a ring, wherein the ring (namely, the hollow core) is arrangeable to surround the electrical power supply. Moreover, the electrical power supply forms the primary winding for the current transformer. The hollow core surrounds the primary winding without any joint thereby ensuring robust nature of the current transformer. The secondary winding is arranged on the hollow core. In this regard, the secondary winding is wound over the hollow core so as to enable induction of current from the primary winding to the secondary winding.

Additionally, primary current and secondary current of the current transformers are proportional to each other, wherein the primary current is current flowing in the primary winding and the secondary current is current flowing through the secondary winding. Furthermore, the primary winding of the current transformer carries current which is to be measured and is further connected to the main load (for example, a distribution transformer, a house-hold load, an industrial load, and so forth). Moreover, the secondary winding is connected to the power conversion module (as discussed in detail herein, later). It will be appreciated that the primary winding and the secondary winding are insulated from the core and each other.

In the current transformer, the primary winding carrying the primary current $I_p$ induces a voltage $V_1$ by mutual inductance M into the secondary winding. Moreover, the secondary winding has an inductance $L_1$. Herein, $$V_1 = j\omega M I_p \qquad (1)$$

$$P = \text{re}\{V_1 I_1^*\} \qquad (2)$$

$$R_m \varphi = I_p - N I_1 \qquad (3)$$

wherein $\omega$ is angular frequency, P is real power coming out due to the induced voltage $V_1$, $I_1$ is current induced by the primary winding, $R_m$ is reluctance of the core, $\varphi$ is magnetic flux in the core, and N is number of turns in the secondary winding. Furthermore, from (2), it is established that for harvesting maximum power from the primary current, the real power (P) is to be maximized by varying $I_1$ given constraint in (3), wherein (3) highlights that magnetic flux should not be allowed to exceed a value at which the core starts to saturate.

Moreover, it is observed that when the current transformer is fed with 90-degree phase shift compared to primary current, then the induced voltage $V_1$ and the induced current $I_1$ are in phase. In such case, (2) gives:

$$P = \omega M I_p I_s$$

wherein $I_p$ is the primary current in the primary winding and $I_s$ is secondary current (notably, $I_1 = jI_s$). Moreover, when $I_p$ and $I_s$ are in 90-degree phase shift, absolute value of magnetic flux constraint (reluctance of the core) is:

$$R_m \varphi = \sqrt{\{I_p^2 + (NI_s)^2\}} \qquad (4)$$

From (4), absolute value of $I_s$ is:

$$I_s = \sqrt{\{(R_m \varphi)^2 - I_p^2\}} \qquad (5)$$

Therefore, optimal power in the secondary winding is harnessed when $I_s$ (namely, secondary current in the secondary winding) is in 90-degree phase shift with $I_p$ and value of $I_p$ is based on (5). Moreover, power output in such case is:

$$P = \omega M I_p \sqrt{\{(R_m \varphi)^2 - I_p^2\}} \qquad (6)$$

Furthermore, from (4), it is established that there are three currents that contribute to creating the magnetic flux ($\varphi$) in the core: $I_p$, re$\{I_1\}$ and im$\{I_1\}$, where re $\{\}$ means real part and im $\{\}$ means imaginary part. Notably, im $\{I_1\}$ produces power as im$\{I_1\}$ is in phase with voltage ($V_1$) induced by the electrical power supply, while $I_p$−re$\{I_1\}$ does not produce power, but create magnetic flux. Therefore, optimal power harnessing from the primary winding takes place when $I_p$−re$\{I_1\}$ is zero. Subsequently, the constraint in (3) becomes:

$$R_m \varphi = I_p - N(I_a + jI_b) \qquad (7)$$

wherein $I_a$ and $I_b$ are real and imaginary parts of $I_s$, respectively. Furthermore, setting $I_p - N I_a = 0$, gives magnitude of $I_b$ as:

$$|I_b| = (R_m \varphi)/N \qquad (8)$$

Hence, secondary current induced in the secondary winding is optimally:

$$I_s = (I_p/N) + j\{(R_m \varphi)/N\} \qquad (9)$$

Subsequently, optimally harnessed power in the secondary winding becomes:

$$P = \omega M I_p \{(R_m \varphi)/N\} \qquad (10)$$

Since, $M = N/R_m$, hence, $$P = \omega \varphi I_p \qquad (11)$$

Thus, from (11), optimal harnessed power in the secondary winding is proportional to angular frequency, maximum magnetic flux and primary current. Subsequently, effect of saturation that limits power output in higher currents, no longer exists at optimal harnessed power.

Notably, the electrical power supply forming the primary winding carries the primary current $I_p$. Moreover, the primary winding carrying the primary current $I_p$ induces the secondary current $I_s$ in the secondary winding of the current transformer. Moreover, the optimal power to be harnessed from the primary winding is defined by the equation (11).

The power converter comprises the power conversion module coupled to the secondary winding of the current transformer, via the first end and the second end of the secondary winding. Notably, the power conversion module is an electric circuit that converts the induced electrical power in the secondary winding to the target electrical power. Notably, the power conversion module is constructed by employing elements, for example, a plurality of Field-effect transistors (FETs) or similar switching devices, a plurality of inductors, a plurality of capacitors, a plurality of resistors, a plurality of diodes, a plurality of switches, and a plurality of connecting wires.

Optionally, the power conversion module is constructed using a plurality of Field-effect Transistors (FETs), wherein the plurality of Field-effect Transistors are arranged to form at least one half bridge. It will be appreciated that an FET is an electronic device that controls flow of current therethrough, by using electric field. Notably, the FET has three terminals, namely, source, drain and gate. Specifically, the FET controls the flow of current by application of a voltage to the gate terminal, wherein the voltage applied to the gate terminal alters conductivity between the drain terminal and the source terminal thereby allowing controlled flow of current therethrough. Optionally, the plurality of FETs are n-channel FETs, p-channel FETs, or a combination thereof. More optionally, the plurality of FETs are Junction Field-Effect Transistors (JFETs), Metal-oxide-semiconductor Field-Effect Transistors (MOSFETs), Complimentary MOSFETs (CMOSFETs), Metal-Nitride-Oxide-Semiconductor Transistors (MNOS), Modulation-doped FETs (MODFETs), Organic FETs (OFETs), Graphene-based FET (GFETs), Ferro-electric FETs (Fe FETs), or a combination thereof. Furthermore, optionally, the plurality of FETs are constructed using, for example, Silicon Carbide (SiC), gallium arsenide (GaAs), gallium nitride (GaN), indium gallium arsenide (InGaAs), germanium, and graphene.

Figure 2:
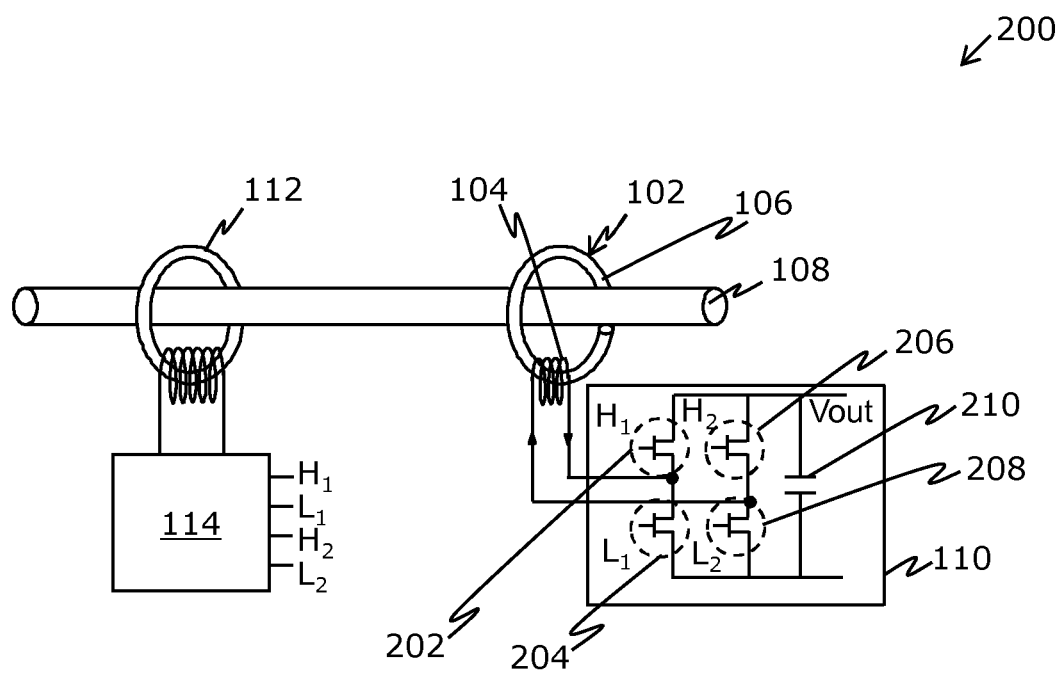
FIG. 2 is a schematic illustration of a power converter, in accordance with an exemplary embodiment of the present disclosure.

For the sake of clarity, the construction of the power conversion module is explained in conjunction with FIG. 2. As shown, the power conversion module is connected to the secondary winding of the current transformer, wherein the current transformer is arranged to surround the electrical power supply when in use. Moreover, FETs 202 and 204, are connected in parallel with the second end of the secondary winding. Additionally, FETs 206 and 208 are connected in parallel with the first end of the secondary winding. In this regard, the plurality of FETs (202, 204, 206 and 208) are connected to form star-configuration (Y-configuration) with the secondary winding. Moreover, secondary current Is flows through the FETs and the secondary winding. Additionally, the FETs 202, 204, 206 and 208 are connected to form a full bridge with the secondary winding. Moreover, a capacitor ($C_1$) is shunted with respect to the full bridge of the power conversion module. Optionally, the capacitor $C_1$ is a super-capacitor. The FETs 202 and 206 are variably triggered by 'HIGH' gate control and the FETs 204 and 208 are variably triggered by 'LOW' gate control. Therefore, the FETs 202 and 206 are triggered by $H_1$ and $H_2$ gate controls, respectively; and the FETs 204 and 208 are triggered by $L_1$ and $L_2$ gate control, respectively. Such gate controls ($H_1$, $H_2$, $L_1$ and $L_2$) are provided by the control unit (as discussed later, herein). It will be appreciated that the connections in the power conversion module are made by employing a plurality of connecting wires. Additionally, rating of the elements (such as FETs, capacitors, and so forth) of the power conversion module is determined based on rating of the electrical power supply and/or load connected with the power conversion module. Furthermore, a load is connected across the full bridge, wherein output generated by the power conversion module (namely, target electrical power) is fed (namely, supplied) to the battery load.

Moreover, optionally, the power conversion module comprises a plurality of modules, wherein a module is implemented using the aforesaid elements to form connections as defined above. More optionally, the plurality of modules, constructed using standardized elements, are arranged in parallel to form the power conversion module. Beneficially, such modular construction of the power conversion module enables easy scaling of the power conversion module based on rating of the electrical power and/or load to be supplied by the power conversion module.

The power converter comprises the at least one sensing module arrangeable to surround the electrical power supply. In deed the at least one sensing module can be arranged to surround for the electrical power supply (line) when the power converter is used for harvesting electrical power from the electrical power supply. The at least one sensing module is operable to measure at least one of: the secondary current, the voltage at the first end of the secondary winding, the voltage at the second end of the secondary winding. Specifically, a sensing module refers to an electronic device comprising at least one sensor configured to detect and/or respond to input. Optionally, the sensing module includes components such as sensors, memory, processor, network adapter, battery, and the like, to detect, store, process and/or share information with other computational elements, such as, a user device, the control unit, and so forth. More optionally, the sensing module operate autonomously to continuously measure at least one of: the secondary current, the voltage at the first end of the secondary winding, the voltage at the second end of the secondary winding and/or target electrical power generated by the power conversion module.

Optionally, at least one sensing module comprises at least one of: current sensor, voltage sensor, temperature sensor. It will be appreciated that the current sensor measures the secondary current induced in the secondary winding of the current transformer. In this regard, the current sensor measures root mean square (RMS) and phase value of the secondary current. The voltage sensor measures the voltage at the first end of the secondary winding and the voltage at the second end of the secondary winding. The voltage sensor measure RMS and phase value of the voltage at the first end and the second end of the secondary winding. The temperature sensor detects a temperature of components (namely, power conversion module, current transformer, and control unit) of the power converter. Optionally, the at least one sensing module measures attributes (namely, voltage and current) of the target electrical power generated by the power conversion module.

It will be appreciated that the at least one sensing module detects attributes of the secondary winding (namely, the secondary current, the voltage at the first end, and the voltage at the second end) induced in the secondary winding by the electrical power supply due to mutual inductance. The said attributes of the secondary winding are communicated to the control unit using wired communication means, wireless communication means, or a combination thereof. Optionally, the sensing module stores the attributes of secondary winding in memory associated therewith. Moreover, optionally, the at least one sensing module communicate the attributes of the secondary winding to the control unit periodically. More optionally, the at least one sensing module communicates the attributes periodically in, for example, every 10 seconds, every 30 seconds, every 1 minute, every 2 minutes, every 5 minutes, and so forth. It will be appreciated that the control unit may set a time period for periodic receiving of attributes from the at least one sensing module.

Optionally, the power converter operates as a fault indicator. Moreover, optionally, the at least one sensing module enables detection of an event of fault by monitoring attributes of the secondary winding. In this regard, the at least one sensing module enables detection of, for example, over current faults, over voltage faults, short circuit faults, open circuit faults, and the like. Furthermore, optionally, an event of fault is identified by the control unit and/or the measuring instruments connected with the secondary winding. In this regard, the power converter sends a disturbance record to a cloud infrastructure of the power converter upon detecting a fault condition. Subsequently, the current transformer provides adequate power to keep the fault indicator (specifically, the at least one sensing module, the control unit, and the power conversion module) operational without having to put them into standby mode. Notably, harnessed power from the current transformer ensures continuous working of the power converter. Moreover, optionally, the cloud infrastructure of the power converter is configured to notify a user associated with the power converter regarding a fault location, a nature of fault, a severity of fault, and the like, thereby ensuring quick rectification of the fault.

Optionally, the power converter operates as a single-phase inverter. In this regard, a sensing module is arranged to surround single-phase electrical power supply, wherein electrical power induced in the secondary winding of the current transformer by the single-phase electrical power supply is converted to DC electrical power by the power conversion module. More optionally, the power converter operates as a three-phase inverter. In this regard, a sensing module is arranged to surround each phase of the three-phase electrical power supply. Moreover, optionally, each of the sensing module is connected to an independent control unit. Furthermore, optionally, a current transformer is arranged to surround each phase of the three-phase electrical power supply, wherein the current transformer is further connected to a power conversion module. In this regard, the power conversion module comprises three parallelly connected modules having connections as described above. Moreover, electrical power induced in secondary winding of each of the current transformer by the three-phase electrical power supply is converted to DC electrical power by the power conversion module.

Optionally, the power converter further comprises at least one battery module to power at least one of: the power conversion module, the at least one sensing module, the control unit. It will be appreciated that battery module comprises one or more battery connected in series or parallel configuration with at least one of: the power conversion module, the at least one sensing module, the control unit, to trigger operation thereof. More optionally, the battery module provides DC power to trigger the power conversion module, the at least one sensing module, the control unit. It will be appreciated that rating of the battery module is dependent on rating of the power conversion module, the at least one sensing module, the control unit.

Optionally, the power conversion module is further connected to at least one of: a capacitor, a supercapacitor, a battery, a load. In this regard, the power conversion module operates to supply target electrical power (DC voltage) to at least one of the: capacitor, supercapacitor, battery, load. In an example, the power conversion module is operable to supply power harnessed in the secondary winding to a sensing load connected to the power conversion module, wherein the sensing load operates in a wireless environment, for example, smart grid environment, Internet of Things (IoT) environment, and the like.

The power converter comprises the control unit coupled to the at least one sensing module and the power conversion module. The control unit refers to a computational element that is operable to respond to and processes instructions that drive the power converter. Optionally, the control unit includes, but is not limited to, a microprocessor, a microcontroller, a complex instruction set computing (CISC) microprocessor, a reduced instruction set (RISC) microprocessor, a very long instruction word (VLIW) microprocessor, or any other type of processing circuit. Pursuant to embodiments of the present disclosure, the control unit is configured to store, process and respond to sensor data received from the at least one sensing module. Moreover, the control unit is configured to enable desired operation of the power conversion module.

The control unit is operable to determine the target electrical power based on sensor data from the at least one sensing module. Specifically, the control unit determines a target secondary current value using the measured attributes of the secondary winding. Herein, the measured attributes of the secondary winding are the sensor data provided by the at least one sensor to the control unit. The target electrical power refers to electrical power to be generated by the power conversion module. Optionally, the target electrical power is dependent on the load connected to the power conversion module, optimal power to be harnessed from the primary winging, or both. Moreover, optionally, the target electrical power or the target secondary current is calculated using a predefined equation or a look up table having values originating from the predefined equation. Optionally, the predefined equation is at least one of the equations (9), (11).

Optionally, the control unit processes the attributes of the secondary winding, by employing a processing device associated with the control unit. It will be appreciated that the processing device is operable to execute a collection or set of instructions that configures the processing device to perform a task for processing the attributes of the secondary winding. Optionally, the processing device comprises processor, memory, network adapter, and the like. More optionally, the processing device is a remote server. Notably, the processing device performs computations (namely, calculations) for the control unit based on the predefined equation. Moreover, the processing device enables a user of the power converter to make adjustments to the power converter, for example, setting specific power flow criteria in the power converter, setting different value for the target electrical power, and so forth. Such adjustments to the power converter can be made without changing hardware (specifically, circuitry) of the power conversion module thereby making the power converter flexible to needs of the user.

Optionally, the target electrical power can be calculated so that the secondary current is in 90-degree phase shift compared to the primary current and an amplitude of the secondary current is defined such that the core flux is as high as possible, without getting the core to saturate.

The control unit determines regulation attribute for the power conversion module, based on the target electrical power. Specifically, the regulation attribute refers to adjustments in the power conversion module to enable the power conversion module to generate the target electrical power. More specifically, regulation attributes are parameters of operational conditions of the power conversion module, that are to be modulated (namely, adjusted). Optionally, the regulation attribute for the power conversion module is based on a duty cycle of the power conversion module. In this regard, the duty cycle (D) for the power conversion module is determined based on target electrical power and/or target secondary current, wherein optimal power can be harnessed in the secondary winding at the target secondary current. More optionally, the regulation attribute comprise a time for triggering gate controls of each of the plurality of FETs of the power conversion module, a voltage of gate control to be provided to the plurality of FETs, duty cycle for the power conversion module, conductance of the circuit of the power conversion module, inductance for the circuit of the power conversion module, mutual inductance for the power conversion module, and the like.

Furthermore, the control unit adjusts the power conversion module based on the determined regulation attribute to enable the power conversion module to generate the target electrical power. It will be appreciated that upon adjustment of the power conversion module, the target electrical power flows through the secondary winding of the current transformer. The power conversion module arrangement comprises a plurality of half bridges constructed using the plurality of field-effect transistors and the plurality of field-effect transistors are variably triggered to generate the target electrical power. In this regard, the control unit provides instructions or variably triggers the plurality of FETs of the power conversion module, for example, by arranging micro-timings for controls of Pulse Width Modulation (PWM) of the plurality of FETs. It will be appreciated that the plurality of FETs are variably triggered by providing gate controls (specifically, voltage to gate terminal) thereto. Herein, the gate controls for the plurality of FETs may be high or low. Furthermore, the control unit determines the timing for gate controls based on PWM and duty cycles.

In an example, regulation attribute (specifically, duty cycle) for the power conversion module is determined to be 0.3. In such case, the plurality of FETs of the converter arrangement are supplied with high gate control for 0.3 of time and with low gate control for 0.7 of the time. Moreover, optionally, the plurality of FETs of the power conversion module are triggered by using the battery module, power harnessed in the secondary winding of the current transformer, or a combination thereof. Additionally, the plurality of FETs are variably triggered by supplying gate control at different time instants to enable the power conversion module to generate the target electrical power.

The control unit further comprises a control loop, wherein the control loop is operable to adjust the power conversion module based on the determined regulation attribute. More optionally, the control loop is implemented using a Proportional Integral (PI) controller, a Proportional Integral Derivative (PID) controller, and the like. Optionally, the control loop is a current control loop. Subsequently, the target secondary current is inputted to the control loop by the processing device of the control unit. The control loop further adjusts regulation attribute (for example, duty cycle) of the power conversion module in such a way that electrical power generated by the power conversion module is equal to the target electrical power. The control loop adjusts the power conversion module based on the regulation attribute so that the power conversion module sinks current in the secondary winding of the current transformer in a manner that power harnessed in the secondary winding is maximized and core does not get saturated. The power harnessing is maximized, while keeping the magnetic flux well below saturation value with a control algorithm. In the control algorithm the duty cycles (D) of the power conversion module are adjusted gradually in a way, that the delivered power achieves the required level, for example based on gradient descent method. For doing this adjustment of duty cycle (D) of the power conversion module for getting the optimal power from the secondary winding, the voltage over the secondary winding is monitored and the value of the secondary winding voltage is kept smaller than a defined saturation value. The defined saturation value is calculated by magnetic flux of the current transformer being the number of turns in the secondary winding multiplied with the derivative of the magnetic flux. Inversion of this relationship gives the magnetic flux, given voltage in the secondary winding. Therefore, power harnessing is maximized in a way that the secondary winding voltage is kept below the defined saturation value. The technical effect of the control unit comprising a control loop is that the output generated by the power conversion module (namely, the target electrical power) is maximized, whilst ensuring that the core of the current transformer does not get saturated. Thus, the power converter ensures an optimal and continuous supply of power to a load, thereby preventing premature failure of the load and/or additional energy loss owing to inefficient operation of the load. Since the core of the current transformer does not get saturated, negative effects of saturation that limit power output in higher currents are beneficially avoided. Therefore, the control unit comprising the control loop provides a reliable power converter for harvesting electrical power from an electrical power supply.

Optionally, the optimal power harnessed in the secondary winding of the current transformer charges the capacitor $C_1$ shunted with the load, wherein the capacitor provides energy to the load when it is charged. It will be appreciated that when voltage in the secondary winding is zero, then the control unit is at sleep (not operating). In such case the capacitor $C_1$ is charged passively by body diodes of the FETs of the power conversion module.

Moreover, the present description also relates to the method as described above. The various embodiments and variants disclosed above apply mutatis mutandis to the method.

The method comprises employing a control loop of the control unit to adjust the power conversion module based on the determined regulation attribute.

Optionally, the regulation attribute for the power conversion module is based on a duty cycle of the power conversion module.

Optionally, the method is implemented for fault indication.

Additionally or alternatively, a method for harvesting electrical power from an electrical supply using a power converter is provided. The power converter for harvesting electrical power from an electrical power supply is used. The power converter for the method comprises a current transformer, the current transformer comprising a secondary winding, having a first end and a second end, arranged upon a hollow core, wherein the hollow core of the current transformer is arrangeable to surround the electrical power supply such that the electrical power supply induces a secondary current in the secondary winding;
  a power conversion module coupled to the secondary winding of the current transformer, via the first end and the second end of the secondary winding;
  at least one sensing module arrangeable to surround the electrical power supply line, wherein the at least one sensing module is operable to measure at least one of: a primary current, a voltage at the first end of the secondary winding, a voltage at the second end of the secondary winding; and
  a control unit coupled to the at least one sensing module and the power conversion module, wherein the control unit is operable to:
    determine a target electrical power based on sensor data from the at least one sensing module;
    determine regulation attribute for the power conversion module, based on the target electrical power; and
    adjust the power conversion module based on the determined regulation attribute to enable the power conversion module to generate the target electrical power.

The method comprises further arranging a current transformer of the power converter to surround the electrical power supply line and arranging at least one sensing module of the power converter to surround the electrical power supply line. In practical terms this can be done for example when installing the power converter to a target environment such as to high voltage power line system. The method further comprises harvesting electrical power from the electrical power supply and using the harvested electrical power to power a sensor. The powered sensor can be integral part of the power converter or the powered sensor can be connected to the power converter using wires. The powered sensor can be for example an Internet of Things (IoT) device.

DETAILED DESCRIPTION OF THE DRAWINGS

Referring to FIG. 1, there is shown a schematic illustration of a power converter 100, in accordance with an embodiment of the present disclosure. The power converter 100 comprises a current transformer 102, a power conversion module 110, at least one sensing module (depicted as sensing module 112) and control unit 114. As shown, the current transformer 102 comprises a secondary winding 104 and a hollow core 106. Moreover, the secondary winding 104, having a first end and a second end, is arranged upon the hollow core 106. Additionally, the hollow core 106 of the current transformer 102 is arranged to surround an electrical power supply 108 such that the electrical power supply 108 induces a secondary current in the secondary winding 104. Moreover, the power conversion module 110 is coupled to the secondary winding 104 of the current transformer 102, via the first end and the second end of the secondary winding 104. Furthermore, the sensing module 112 is arranged to surround the electrical power supply 108, wherein the sensing module 112 is operable to measure at least one of: a primary current, a voltage at the first end of the secondary winding 104, a voltage at the second end of the secondary winding 104.

The control unit 114 is coupled to the sensing module 112 and the power conversion module 110. The control module 114 is arranged to receive operating power from the power conversion module 110 via power lines of the coupling. The control module 114 is further arranged to provide control signals to the power conversion module 110 via signal lines of the coupling. The control unit 114 is operable to determine a target electrical power based on sensor data from the sensing module 112, determine regulation attribute based on the target electrical power for the power conversion module 110 and adjust the power conversion module 110 based on the determined regulation attribute to enable the power conversion module 110 to generate the target electrical power. The power conversion module 110 provides operating voltage Vout to a sensor 120.

It may be understood by a person skilled in the art that the FIG. 1 include simplified block diagrams 100 for sake of clarity only, which should not unduly limit the scope of the claims herein. The person skilled in the art will recognize many variations, alternatives, and modifications of embodiments of the present disclosure.

Referring to FIG. 2, there is shown a schematic illustration of a power converter 200, in accordance with an exemplary embodiment of the present disclosure. As shown, the power converter 200 comprises a current transformer 102, a power conversion module 110, at least one sensing module (depicted as sensing module 112) and control unit 114. Moreover, the current transformer 102 comprises a secondary winding 104 and a hollow core 106. The secondary winding 104, having a first end and a second end, is arranged upon the hollow core 106. Additionally, the hollow core 106 of the current transformer 102 is arranged to surround an electrical power supply 108 such that the electrical power supply 108 induces a secondary current in the secondary winding 104. Moreover, the power conversion module 110 is coupled to the secondary winding 104 of the current transformer 102, via the first end and the second end of the secondary winding 104. Furthermore, the sensing module 112 is arranged to surround the electrical power supply 108. The control unit 114 is coupled to the sensing module 112 and the power conversion module 110. The power conversion module 110 is constructed using a plurality of Field-Emitting Transistors (FETs) (depicted as FETs 202A, 202B, 202C and 202D).

As shown, FETs 202 and 204, are connected in parallel with the second end of the secondary winding 104. Additionally, FETs 206 and 208 are connected in parallel with the first end of the secondary winding 104. In this regard, the FETs 202, 204, 206 and 208 are connected to form star-configuration (Y-configuration) with the secondary winding 104. Moreover, secondary current Is flows through the FETs 202, 204, 206 and 208 and the secondary winding 104. Additionally, the FETs 202, 204, 206 and 208 are connected to form a full bridge with the secondary winding 104. Moreover, a capacitor 210 ($C_1$) is shunted with respect to the full bridge of the power conversion module 110. The FETs 202 and 206 are variably triggered by 'HIGH' gate control, namely, $H_1$ and $H_2$ gate controls, respectively; and the FETs 204 and 208 are variably triggered by 'LOW' gate control, namely. $L_1$ and $L_2$ gate control, respectively. Such gate controls ($H_1$, $H_2$, $L_1$ and $L_2$) are provided by the control unit 114 (as shown). Output voltage Vout is provided by the power converter. The output voltage (and power) can be used by a sensor or other electronics.

It may be understood by a person skilled in the art that the FIG. 2 is merely an example, which should not unduly limit the scope of the claims herein. The person skilled in the art will recognize many variations, alternatives, and modifications of embodiments of the present disclosure.

Figure 3:
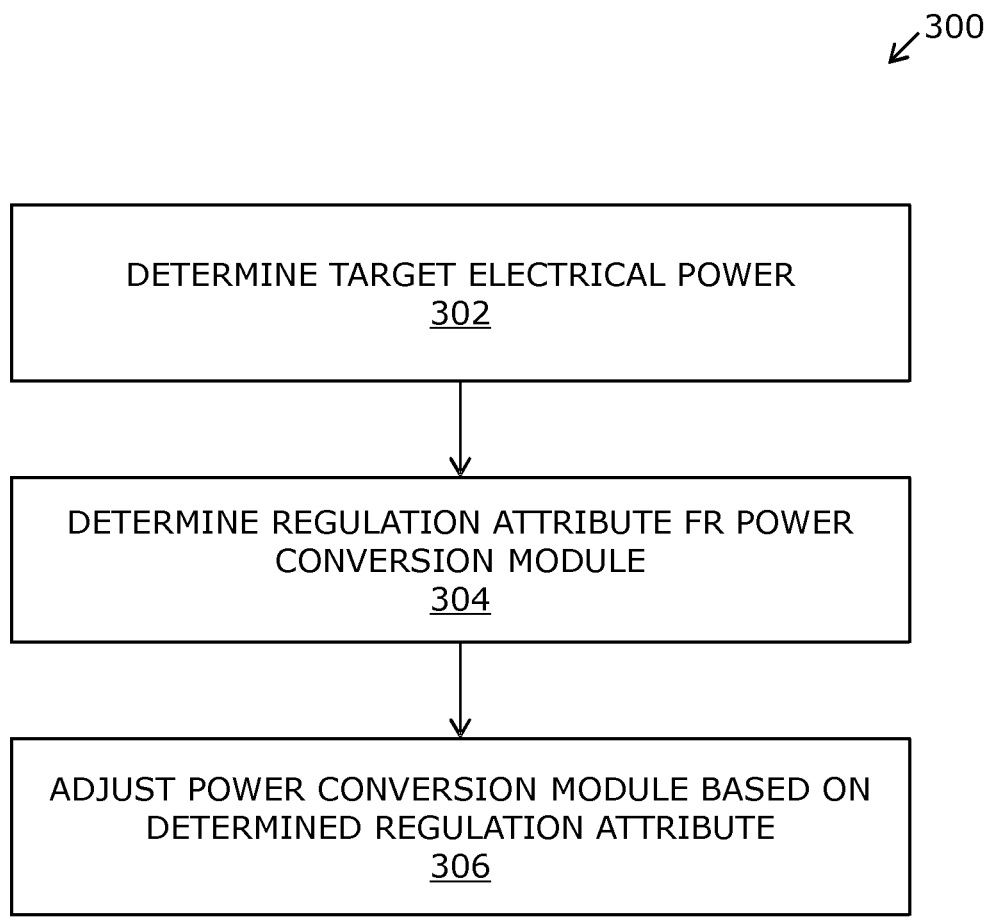
FIG. 3 is a flow chart depicting steps of a method for converting electrical power from an electrical power supply, in accordance with an embodiment of the present disclosure.

Referring to FIG. 3, there is shown a flow chart depicting steps of a method 300 for converting electrical power from an electrical power supply, in accordance with an embodiment of the present disclosure. The method 300 is implemented via a power converter comprising a current transformer, a power conversion module, at least one sensing module and a control unit. At a step 302, a target electrical power based on sensor data from the at least one sensing module is determined using the control unit. Notably, the sensor data is at least one of: secondary current in secondary winding of the current transformer, a voltage at a first end of the secondary winding, a voltage at a second end of the secondary winding. At a step 304, regulation attribute for the power conversion module is determined based on the target electrical power, using the control unit. At a step 306, the power conversion module is adjusted, using the control unit, based on the determined regulation attribute to enable the power conversion module to generate the target electrical power.

The steps 302, 304 and 306 are only illustrative and other alternatives can also be provided where one or more steps are added, one or more steps are removed, or one or more steps are provided in a different sequence without departing from the scope of the claims herein.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A power converter for harvesting electrical power from an electrical power supply, the power converter comprising:
    a current transformer, the current transformer comprising a secondary winding having a first end and a second end, the secondary winding arranged upon a hollow core, wherein the hollow core of the current transformer is configured to surround an electrical power supply line and the electrical power supply line induces a secondary current in the secondary winding;
    a power conversion module coupled to the secondary winding of the current transformer, via the first end and the second end of the secondary winding;
    at least one sensing module configured to surround the electrical power supply line, wherein the at least one sensing module is configured to measure at least one of: a secondary current, a voltage at the first end of the secondary winding, a voltage at the second end of the secondary winding; and
    a control unit coupled to the at least one sensing module and the power conversion module, wherein the control unit is configured to:
        determine a target electrical power based on sensor data from the at least one sensing module;
        determine a regulation attribute for the power conversion module, based on the target electrical power; and adjust the power conversion module based on the determined regulation attribute to enable the power conversion module to generate the target electrical power,
wherein the control unit further comprises a control loop, wherein the control loop is configured to adjust the power conversion module based on the determined regulation attribute, so that the power conversion module sinks the secondary current in the secondary winding to maximize the target electrical power and the hollow core of the current transformer is not saturated, wherein a voltage of the secondary winding is monitored and a value of the voltage of the secondary winding is kept smaller than a defined saturation value, and
wherein the defined saturation value is calculated by magnetic flux of the current transformer being a number of turns in the secondary winding multiplied with a derivative of the magnetic flux.

2. The power converter of claim 1, wherein the power converter is configured to operate as a single-phase inverter.

3. The power converter of claim 1, wherein the power converter is configured to operate as a three-phase inverter, wherein the at least one sensing module is configured to surround each phase of a three-phase electrical power supply, and wherein the at least one sensing module is connected to an independent control unit, further wherein the current transformer is configured to surround each phase of the three-phase electrical power supply.

4. The power converter of claim 1, wherein the power converter is configured to operate as a fault indicator, and wherein the at least one sensing module enables detection of an event of fault by monitoring attributes of the secondary winding.

5. The power converter of claim 1, wherein the regulation attribute for the power conversion module is based on a duty cycle of the power conversion module.

6. The power converter of claim 1, wherein the power conversion module is further connected to at least one of: a capacitor, a supercapacitor, a battery, a load.

7. The power converter of claim 1, wherein the power conversion module is composed of a plurality of Field-Effect Transistors, wherein the plurality of Field-Effect Transistors are configured to form at least one half bridge.

8. A method for harvesting electrical power from an electrical power supply, wherein the method is implemented via a power converter comprising a current transformer, a power conversion module, at least one sensing module and a control unit, the method comprising:
determining, using the control unit, a target electrical power based on sensor data from the at least one sensing module, wherein the sensor data is at least one of: a secondary current in a secondary winding of the current transformer, a voltage at a first end of the secondary winding, a voltage at a second end of the secondary winding;
determining, using the control unit, a regulation attribute for the power conversion module based on the target electrical power; and
adjusting, using the control unit, the power conversion module based on the determined regulation attribute to enable the power conversion module to generate the target electrical power, wherein the control unit comprises a control loop, and
the method further comprises:
employing the control loop to adjust the power conversion module based on the determined regulation attribute so that the power conversion module sinks the secondary current in the secondary winding in a manner that the target electrical power is maximized and the hollow core of the current transformer is not saturated,
wherein a voltage of the secondary winding is monitored and a value of the voltage of the secondary winding is kept smaller than a defined saturation value, and
wherein the defined saturation value is calculated as a product of a number of turns in the secondary winding and a derivative of magnetic flux of the current transformer.

9. The method of claim 8, wherein the regulation attribute for the power conversion module is based on a duty cycle of the power conversion module.

10. The method of claim 8, wherein the method is implemented for fault indication, and wherein the at least one sensing module enables detection of an event of fault by monitoring attributes of the secondary winding.

11. A method for harvesting electrical power from an electrical power supply using a power converter comprising a current transformer, a power conversion module, at least one sensing module, and a control unit, the method comprising:
arranging the current so that a hollow core of the current transformer surrounds an electrical power supply line;
arranging the at least one sensing module to surround the electrical power supply line;
determining, using the control unit, a regulation attribute for the power conversion module based on a target electrical power;
adjusting, using the control unit, the power conversion module based on the determined regulation attribute to enable the power conversion module to generate the target electrical power;
employing a control loop of the control unit to adjust the power conversion module based on the determined regulation attribute so that the power conversion module sinks a secondary current in a secondary winding in a manner that the target electrical power is maximized and the hollow core of the current transformer is not saturated;
monitoring a voltage of the secondary winding and maintaining a value of the voltage below a defined saturation value, wherein the defined saturation value is calculated as a product of a number of turns in the secondary winding and a derivative of magnetic flux of the current transformer; and
using harvested electrical power to power a sensor.

* * * * *